United States Patent [19]

Inagaki et al.

[11] 4,316,204
[45] Feb. 16, 1982

[54] OPTOELECTRONIC SEMICONDUCTOR DEVICE

[75] Inventors: Nobuhiro Inagaki; Eiichi Kitamura; Ryosuke Namazu, all of Yokohama, Japan

[73] Assignee: Fujitsu Limited, Kawasaki, Japan

[21] Appl. No.: 118,973

[22] Filed: Feb. 6, 1980

[30] Foreign Application Priority Data

Feb. 9, 1979 [JP] Japan .................................. 54-14471

[51] Int. Cl.³ ............................................. H01L 27/14
[52] U.S. Cl. ........................................ 357/30; 357/17; 350/96.20
[58] Field of Search ........................... 357/17, 18, 30; 350/96.20, 96.21

[56] References Cited

U.S. PATENT DOCUMENTS

| | | | |
|---|---|---|---|
| 4,119,363 | 10/1978 | Camlibel | 350/96.20 |
| 4,152,713 | 5/1979 | Copeland | 357/19 |
| 4,167,744 | 9/1979 | Nyul | 357/17 |
| 4,186,996 | 2/1980 | Bowen | 350/96.20 |
| 4,233,619 | 11/1980 | Webb | 357/74 |

*Primary Examiner*—Martin H. Edlow
*Attorney, Agent, or Firm*—Staas & Halsey

[57] ABSTRACT

An optoelectronic semiconductor device for use in an optical transmission system, comprising: an optoelectronic semiconductor element; an element housing which seals covers said element; and an optical fiber arranged through a through hole which is formed in said element housing. An end of said fiber faces said element, while the other end thereof projects out of said element housing by a predetermined length. The device is characterized in that a light absorbing material is disposed around said optical fiber within said element housing. Said material substantially absorbs the light emitted from or received by said optoelectronic semiconductor element.

6 Claims, 6 Drawing Figures

OPTOELECTRONIC SEMICONDUCTOR DEVICE

BACKGROUND OF THE INVENTION

1. Field of the Invention

The present invention relates to an optoelectronic semiconductor device which comprises a cap through which an optical fiber penetrates for introducing light into or out of the device.

2. Description of the Prior Art

After optoelectronic semiconductor devices are produced the products are tested for defining the characteristic thereof. Various optical signal transmission systems are available and use of the optoelectronic semiconductor device is based on the result of the tests. In the past, the result of the test of the optical output power of the device differed from the actual amount of optical output power transmitted through an optical transmission fiber. Therefore, the reliability of the result of the characteristic tests is degraded

SUMMARY OF THE INVENTION

It is an object of the present invention to improve the optoelectronic semiconductor device so that reliable results of the characteristic tests can be obtained.

DETAILED DESCRIPTION OF THE PREFERRED EMBODIMENTS

Figure 1:
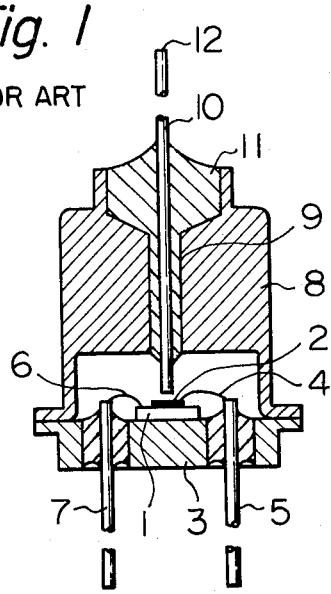
FIG. 1 is a sectional view of an optoelectronic semiconductor device comprising an optical fiber according to the prior art.

A known optoelectronic semiconductor device which houses a light emitting diode (LED), a photo diode or a photo transistor for use in an optical signal transmission system is illustrated in FIG. 1. FIG. 1 shows a beryllium oxide (BeO) plate 1 for electrically insulating an optoelectronic semiconductor element from the device body. Both surfaces of the plate 1 are plated with gold (Au). A light emitting diode chip 2 is bonded on one surface of the plate 1. The plate 1 is mounted on a main surface of a stem (or mounting) 3. A terminal pad of the cathode of the chip 2 is electrically connected to an external lead 5 through a wire 4. The upper surface of the plate 1 to which the anode surface of the chip is bonded is electrically connected to an external lead 7 through a wire 6. The chip 2, wires 4, 6, and the external leads 5, 7 of e.g. Kovar are protected by a metal cap 8. The metal cap 8 has a central through hole 9. An optical fiber 10 is inserted into the hole 9 and secured to the cap 8 by means of a sealing resin 11. The cap 8 and the stem 3 are welded together so as to form an optoelectronic semiconductor device body. The distance between the upper surface of the chip 2 and the lower end surface of the optical fiber 10 is adjusted so that a desired optical connecting efficiency between the chip and the fiber is obtained. The optical axis of the chip 2 is aligned with the optical axis of the optical fiber 10. The projection length of the optical fiber 10 out of the cap 8 is about 1 cm. The optical fiber 10 is connected to a long optical transmission fiber through a connector (not shown).

Figure 2:
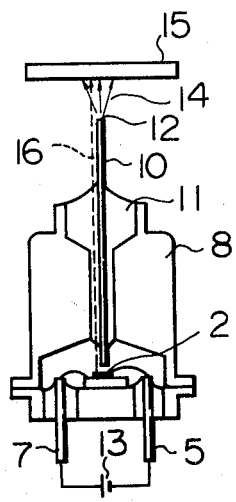
FIG. 2 is a diagramatic view of a manner of an optical output power test of the light from the end of the optical fiber of the device.

The inner diameter of the through hole 9 of the cap 8 is larger than the outer diameter of the optical fiber 10 so that the optical fiber 10 can be easily inserted into the through hole 9. Therefore, said sealing resin 11 is necessitated so as to fill the hole. In the past, the resin material was chosen from the viewpoint of bonding ability, characteristic with respect to temperature, or purity of the material. The transparency of the material was not taken into consideration. In this respect, the prior art device will be described referring to FIG. 2. FIG. 2 shows an optical output power test of the light emitting from the top of the fiber end 12 of the device of FIG. 1. When the light emitting diode chip 2 is properly biased by a battery 13, the chip emits light. The light 14 (shown by solid arrows) radiates from the top of the fiber end 12 and is received by a photo diode 15. The electric current generated by the light in the photo diode 15 is converted to voltage which value is measured by a digital voltage meter; thereby, the optical output power from the optical fiber 10 can be measured. However, in this measurement, the light 16 which passes through the space between the metal cap 8 and the optical fiber 10, as illustrated by an arrow in a broken line, is also received by the photo diode 15 through the resin 11. Therefore, the measured output power is greater than the effective output power of the light 14 which is emitted from the fiber end.

In the optoelectronic semiconductor device according to the present invention, optical output power of the light from the fiber can be correctly measured by substantially intercepting the light through the resin.

Figure 3:
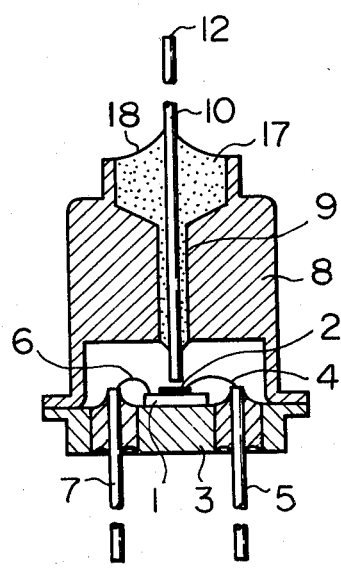
FIG. 3 is a sectional view of an optoelectronic semiconductor device according to the present invention.

In FIG. 3, which is a sectional view of an optoelectronic semiconductor device of the present invention, like parts as in FIG. 1 are designated by like numerals. The optoelectronic semiconductor device illustrated in FIG. 3 is constructionally the same as that illustrated in FIG. 1, except that the characteristic of the sealing resin 17 which fills the through hole 9 of the cap 8 is different from that of the resin in FIG. 1. The resin 17 has a high coefficient of absorption of the light at the wave length equal to that of the light emitted from the light emitting diode 2. If the light from the light emitting diode 2 has the wave length of 0.82 $\mu$m, black epoxy resin (e.g. "epoxy resin No. 6070" produced by Nitto Electric Industry Ltd. Japan, or "epoxy resin C59J" produced by HYSOL Inc., U.S.A.) which absorbs the above light is used. The light which enters the space between the metal cap 8 and the optical fiber 10 from the light emitting diode 2 is substantially absorbed by the resin 17. Therefore, the optical power of the light from the end surface 18 of the resin, which light corresponds to the light 16 of FIG. 2, is negligible relative to the optical power of the light from the optical fiber 10, which light corresponds to the light 14 of FIG. 2. Accordingly, the optical output power of the light from the fiber end can be correctly measured in the test mode shown in FIG. 2.

Figure 4:
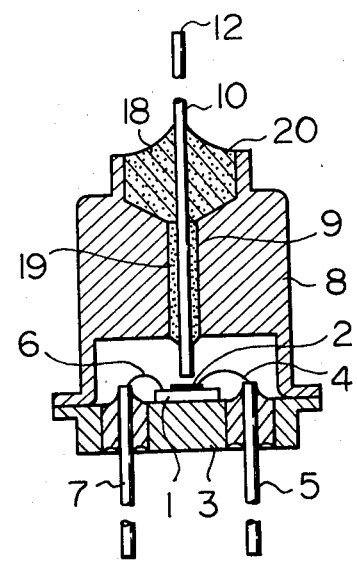
FIG. 4 is a sectional view of another embodiment of the present invention.

FIG. 4 is a sectional view of another embodiment of the present invention. In FIG. 4, like parts as in FIG. 1 or 3 are designated by like numerals. The optoelectronic semiconductor device illustrated in FIG. 4 is constructionally the same as that illustrated in FIG. 3, except that the arrangement of the sealing resin which fills the through hole 9 of the cap 8 is different from that of the resin in FIG. 3. That is, the sealing resin comprises a first resin 19 for securing the optical fiber 10 to the metal cap 8 and a second resin 20 for light absorption arranged around the outlet of the optical fiber 10. The first resin 19 is chosen from the viewpoint of a thermohardening property or a securing ability in order to reliably secure the optical fiber 10 to the cap 8. The second resin 20 is chosen mainly from the viewpoint of a light absorption ability. The first resin 19 is, for example, "epoxy resin H74" produced by EPOXY TECHNOLOGY Inc., U.S.A. The second resin 20 is, for example, "silicone resin JCR SH6102" produced by Toray Silicone Inc., Japan. The epoxy resin H74 assumes a brown colour after thermohardening and permits light to pass therethrough to some degree. The silicone resin JCR SH6102 assumes a black colour and absorbs light effectively. Therefore, a part of the light, e.g. the light of a wave length of 0.82 μm emitted from the light emitting diode, passes through the epoxy resin H74 and then it is absorbed by the silicone resin JCR SH6102.

In the device using the above resins, the light, which enters the space between the metal cap 8 and the optical fiber 10, emitted from the light emitting diode 2 or reflected by the inside surface of the device is substantially absorbed by the second resin 20, because the resin 20 is chosen beforehand so that it is able to absorb the light from the light emitting diode 2. Therefore, the optical power of the light from the end surface 18 of the resin, which light corresponds to the light 16 of FIG. 2, is negligible relative to the optical power of the light from the optical fiber 10, which light corresponds to the light 14 of FIG. 2. Accordingly, the optical output power of the light from the optical fiber end can be correctly measured in the test mode shown in FIG. 2.

Figure 5:
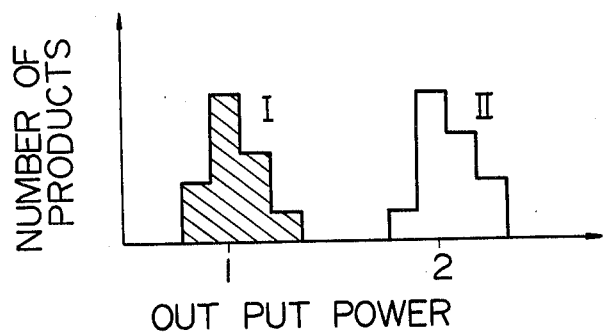
FIG. 5 is a graphical view representing the result of the optical output power tests of the devices of FIG. 1 and FIG. 3.

FIG. 5 represents the result of the optical output power measurement of the optoelectronic semiconductor devices, each having an optical fiber 10 which is sealingly secured to the device either by the resin 11 or by the resin 17. The abscissa represents the optical output power calibrated in absolute number. The ordinate represents the number of the devices. There are two groups I and II respectively around the marks 1 and 2 of the abscissa. Group I comprises devices using the resin 17 of high absorption ability of light according to the present invention. Group II comprises devices of FIG. 1 using the resin 11 of low absorption ability of light. In group II, the devices of high output power are more in number than the devices of low output power, while in group I, the devices of high output power are less in number than the devices of low output power.

Since each diode chip 2 of the devices has an equal emission intensity value, the output power difference between the groups I and II is due to the difference of the optical power of the light which passes through the resin. The light is intercepted in the resin 17 according to the present invention. Therefore, the above difference corresponds to the amount of the light which has passed through the resin 11.

Figure 6:
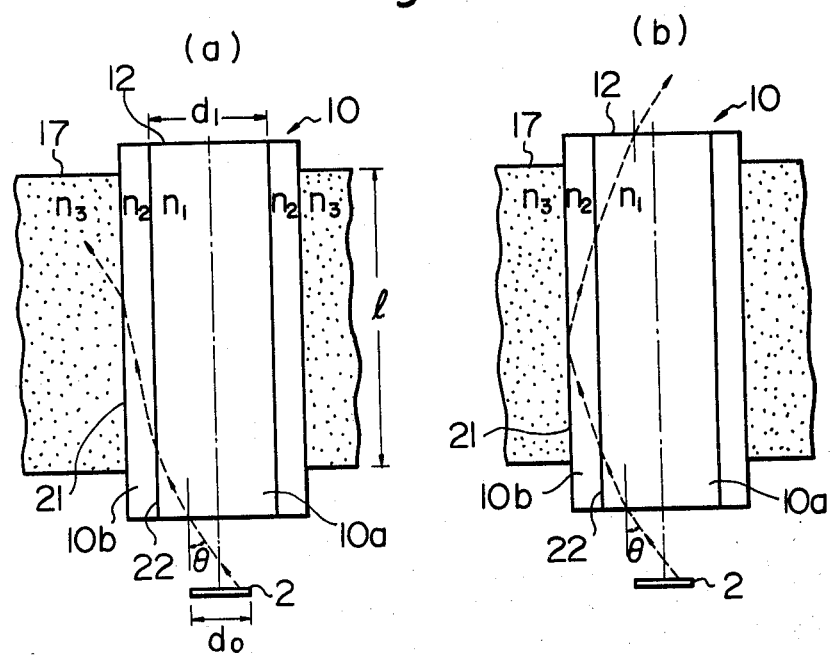
FIGS. 6 (a) and (b) are diagramatic views showing light beams introduced into optical fibers each of which is surrounded by a resin material having a different refractive index from that of the fiber.

Referring to FIG. 6, the sealing resin 17 will now be described from the viewpoint of its refractive index as compared with the refractive index of the optical fiber 10. In the light which enters the step index type optical fiber 10 from the light emission diode 2, the effective light is the light which enters at an incidence angle less than the critical incidence angle $\theta_0$ which is dependent upon the numerical apperture NA of the optical fiber 10. The critical incidence angle $\theta_0$ is defined as follows;

$$\theta_0 = \sin^{-1} NA = \sin^{-1} \sqrt{n_1{}^2 - n_2{}^2}$$

in which $n_1$ is the refractive index of the core 10a of the optical fiber 10 and $n_2$ is the refractive index of the clad layer 10b of the optical fiber 10.

The light enters the fiber at an incidence angle $\theta$ which is greater than $\theta_0$. The arrangement of the media is the same as that of FIG. 3. The refractive index of the resin 17 is $n_3$. The diameter of the core 10a is $d_1$. The length of the optical fiber 10 adjacent to the resin 17 is l. The length l can be regarded as $l >> d_1$. If $n_2$ is smaller than $n_3$, the light from the diode 2 into the optical fiber 10 at the angle $\theta$ advances as shown by the broken line in FIG. 6(a), while if $n_2$ is greater than $n_3$, the light advances as shown by the broken line in FIG. 6(b), according to Snell's Law with respect to refraction. In the case that $n_2$ is smaller than $n_3$, the light introduced at an angle $\theta$ which is greater than $\theta_0$ penetrates into the resin 17 and is absorbed therein, as depicted in FIG. 6(a), instead of being reflected in the boundary surface 21 between the resin 17 and the clad layer 10b, which is the case if $n_2$ is greater than $n_3$, as depicted in FIG. 6(b). The effective transmission light is the light which is transmitted directly within the core 10a or the light which is reflected in the boundary surface 22 between the clad layer 10b and the core 10a. The light reflected in the boundary surface 21 is not effective light for optical signal transmission. The amount of the non-effective light increases if the diameter $d_0$ of the diode increases or if the diameter $d_1$ of the core 10a decreases.

The resin 17 of FIG. 3 preferably has the characteristic that its refractive index $n_3$ is greater than the refractive index $n_2$ of the clad layer 10b of the optical fiber 10, in addition to having the characteristic that it absorbs the light from the diode 2. Such a resin can remove the non-effective light for optical signal transmission so that all the light transmitted through the optical fiber 10 can be effectively used for the optical signal transmission.

Also, in the second embodiment of the present invention, the second resin 20 has a greater refractive index than does the clad layer 10b of the optical fiber 10. Therefore, the non-effective light for optical signal transmission is removed by the second resin 20 so that all the light transmitted through the optical fiber 10 can be effectively used for the optical signal transmission.

In the actual use of the device, the wave length of the light of the light emitting diode is 0.82 μm, the core of the optical fiber mode of quartz has a refractive index of 1.469, the clad layer of the optical fiber has a refractive index of 1.469, the first epoxy resin 19 (H74) has a refractive index of 1.5, and the second silicone resin 20 (JCR SH6102) has a refractive index of about 1.5.

The epoxy resin 17 of FIG. 3 can be discriminated from the epoxy resin 11 of FIG. 1 by their colors. Generally, the resin of low absorption ability assumes a brown color while the resin of high absorption ability assumes a black colour. However, the present invention is not limited to the black colored resin.

As mentioned before, in the optical output power test of the optoelectronic semiconductor device according to the present invention, the result of the test reliably corresponds to the actual effective optical power from the optical fiber end because the light which passes through outside the optical fiber is almost all absorbed by the resin. Also, in the present invention, the non-effective light for the optical signal transmission can be removed from the fiber end by using a resin of adequate refractive index so as to remove the light which passes through the clad layer of the optical fiber.

In the above mentioned embodiments, the sealing resin 17 or the second resin 20 constitutes a light absorbing means. In order to enhance the light absorbing ability, further resin or painting material of a high absorption coefficient may be coated on the exposed surface of the resin 17 or 20 either outside or inside of the cap 8. In this case, the resin 17 or 20 may be chosen from the viewpoint of its securing ability for securing the optical fiber to the cap.

In the second embodiment of the present invention, the first resin 19 may have a greater refractive index than does the clad layer 10b of the optical fiber 10 so as to remove the non-effective light for optical signal transmission.

The optoelectronic semiconductor element is not limited to the light emitting diode. The element may be a photo diode or a photo transistor etc.

What is claimed is:

1. An optoelectric semiconductor device for communication with light signals and comprising:

an optoelectric semiconductor element for selectively receiving and generating said light signals;

an element housing which seals and covers said element;

an optical fiber arranged through a through hole which is formed in said element housing, one end of said fiber facing said optoelectric semiconductor element and the other end projecting out of said element housing by a predetermined length, said optical fiber having a core and a clad layer around the core; and a light absorbing material disposed around said clad layer of said optical fiber within said element housing, said light absorbing material having a higher index of refraction than said clad layer and said light absorbing material substantially absorbing the light of said signals being transmitted by said optical fiber between said optoelectronic semiconductor element and the exterior of said device.

2. The device of claim 1, said optoelectronic semiconductor element comprising a light emitting diode.

3. The device of claim 1, said optoelectronic semiconductor element comprising a photodiode.

4. The device of claim 1, said optoelectronic semiconductor element comprising a phototransistor.

5. The device of claim 1, 2, 3 or 4, said light absorbing material comprising a resin material which secures said optical fiber to said element housing.

6. The device of claim 1, said light comprising effective and non-effective components for said communication, said light absorbing material and said clad layer comprising means for selectively removing said non-effective component of said light.

* * * * *

UNITED STATES PATENT AND TRADEMARK OFFICE
CERTIFICATE OF CORRECTION

PATENT NO. : 4,316,204

DATED : Feb. 16, 1982

INVENTOR(S) : Inagaki et al.

It is certified that error appears in the above—identified patent and that said Letters Patent is hereby corrected as shown below:

Column 3, line 67, "Fig. 6" should be --Figs. 6(a) and 6(b)--.

Signed and Sealed this

Sixth Day of July 1982

[SEAL]

Attest:

GERALD J. MOSSINGHOFF

Attesting Officer     Commissioner of Patents and Trademarks